(12) United States Patent
Sharangpani et al.

(10) Patent No.: US 6,303,524 B1
(45) Date of Patent: Oct. 16, 2001

(54) HIGH TEMPERATURE SHORT TIME CURING OF LOW DIELECTRIC CONSTANT MATERIALS USING RAPID THERMAL PROCESSING TECHNIQUES

(75) Inventors: Rahul Sharangpani; Sing-Pin Tay, both of Fremont, CA (US)

(73) Assignee: Mattson Thermal Products Inc., Fremont, CA (US)

( * ) Notice: Subject to any disclaimer, the term of this patent is extended or adjusted under 35 U.S.C. 154(b) by 0 days.

(21) Appl. No.: 09/789,062

(22) Filed: Feb. 20, 2001

(51) Int. Cl.$^7$ .......................... H01L 21/31; H01L 21/469
(52) U.S. Cl. ............................................. 438/780; 438/781
(58) Field of Search ........................... 438/778, 780–784; 427/371, 372.2, 373, 374.1–374.7

(56) References Cited

U.S. PATENT DOCUMENTS

| | | |
|---|---|---|
| 4,331,485 | 5/1982 | Gat . |
| 4,356,384 | 10/1982 | Gat . |
| 4,680,451 | 7/1987 | Gat et al. . |
| 5,238,878 | 8/1993 | Shinohara . |
| 5,358,740 | 10/1994 | Bornside et al. . |
| 5,705,232 | 1/1998 | Hwang et al. . |
| 5,965,047 | 10/1999 | Blersch et al. . |
| 5,972,803 | 10/1999 | Shu et al. . |
| 6,033,728 | 3/2000 | Kikuchi et al. . |
| 6,051,512 | 4/2000 | Sommer et al. . |
| 6,066,574 | 5/2000 | You et al. . |
| 6,107,357 | 8/2000 | Hawker et al. . |
| 6,133,550 | 10/2000 | Griffiths et al. . |
| 6,214,748 * | 4/2001 | Kobayashi et al. ................... 438/782 |
| 6,225,238 * | 5/2001 | Wu ...................................... 438/778 |

FOREIGN PATENT DOCUMENTS

| | | |
|---|---|---|
| 0971400 | 1/2000 | (EP) . |
| WO 9532604 | 11/1995 | (WO) . |

OTHER PUBLICATIONS

Dow Chemical CYCLOTENE 4000 Series Advanced Eletronic Resins (Photo BCB) Revised: May 3, 1999 technical bulletin.

J. Lin and C. Lee, "Grain Boundary Diffusion of Copper in Tantabum Nitride Thin Films," *J. Electrochem Soc.*, 146 (9) 3466–3471 (1999).

Allied Signal FLARE™ Product Bulletin (2/99).

* cited by examiner

*Primary Examiner*—Jey Tsai
(74) *Attorney, Agent, or Firm*—Connolly Bove Lodge & Hutz LLP

(57) ABSTRACT

A method for curing low k dielectric materials uses very short, relatively high temperature cycles instead of the conventionally used (lower temperature/longer time) thermal cycles. A substrate, such as a semiconductor wafer, coated with a layer of coating material is heated to an elevated temperature at a heating rate of greater than about 20° C. per second. Once the coating material has been converted to a low dielectric constant material with desired properties, the coated substrate is cooled. Alternatively, spike heating raises and promptly lowers the temperature of the coated substrate to effect curing in one or a series of spike heating steps. The method allows for a thinner refractory barrier metal layer thickness to prevent copper diffusion, and uses shorter curing times resulting in higher throughput.

34 Claims, 4 Drawing Sheets

HIGH TEMPERATURE SHORT TIME CURING OF LOW DIELECTRIC CONSTANT MATERIALS USING RAPID THERMAL PROCESSING TECHNIQUES

BACKGROUND OF THE INVENTION

1. Field of the Invention

This invention relates to the formation of low dielectric constant ("low k") layers suitable for use in semiconductor devices, and more particularly, to a method for curing low k dielectric materials using very short, relatively high temperature cycles.

2. Background of the Invention

Semiconductor chips are used in many applications, including as processor chips for computers, as integrated circuits, and as flash memory for hand held computing devices, wireless telephones, and digital cameras. Regardless of the application, ideally a semiconductor chip holds as many circuits or memory cells as possible per unit area. In this way, the size, weight, and energy consumption of devices that use semiconductor chips are minimized, while nevertheless improving the memory capacity and computing power of the devices. The escalating requirements for high density and performance associated with ultra-large scale integration semiconductor devices necessitate design features of 0.18 micron and under, increased transistor and circuit speeds, high reliability, and increased manufacturing throughput.

A common circuit component of semiconductor chips is the transistor. In ultra-large-scale integrated (ULSI) semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer. This generally-described structure cooperates to function as a transistor.

A conventional method for forming patterned metal layers comprises a subtractive etching or etch back step as the primary metal forming technique. Such a method involves forming a first dielectric layer on a semiconductor substrate, typically a monocrystalline silicon (Si) wafer, with conductive contacts formed therein for electrical connection with at least one active region formed in or on the substrate, such as a source/drain region of a transistor. A metal layer is deposited on the first dielectric layer and patterned using photolithographic masking and etching techniques to form a desired conductive pattern comprising a metal feature separated by gaps, such as a plurality of metal lines with inter-wiring spacings therebetween. A dielectric layer is then applied to the resulting conductive pattern to fill in the gaps. The surface thereof is then planarized by conventional etching or chemical-mechanical polishing (CMP) techniques.

A through-hole is then formed in the dielectric layer to expose a selected portion of an underlying metal feature. The exposed portion of the metal feature at the bottom of the through-hole serves as a contact pad. Upon filling the through-hole with conductive material, such as a metal plug, to form a conductive via, the bottom surface of the conductive via is in electrical contact with the underlying metal feature.

Many ultra large scale integration (ULSI) devices presently manufactured are very complex and require multiple levels of metallization for interconnections. It has been common to repeat the above-described via formation process multiple times, e.g., to form five levels of metallization interconnected by conductive vias, with each level of metallization separated by at least one layer of dielectric material, termed an inter-level dielectric (ILD) layer.

As semiconductor devices become smaller, and on-chip device density correspondingly increases, signal delays due to capacitive coupling and crosstalk between closely spaced metal lines are increasing. These problems are exacerbated by the need to keep conductor lines as short as possible in order to minimize transmission delays, thus requiring multi-level wiring schemes for the chip. As a consequence, capacitive coupling between conductive lines significantly limits circuit speed. A problem encountered in highly miniaturized semiconductor devices employing multiple metallization levels and reduced inter-wiring spacings in both the horizontal and vertical dimensions is related to the resistance-capacitance (RC) time constant of the system. If intra-metal capacitance is high, electrical inefficiencies and inaccuracies increase. It has been recognized that a reduction in capacitance within the multi-level metallization system will reduce the RC time constant between the conductive lines. The use of an insulator with a lower dielectric constant than the silicon dioxide (k=3.9) that is currently used could improve the situation. (The dielectric constant is based on a scale where 1.0 represents the dielectric constant of a vacuum.) As used herein, the term "low k" will refer to materials that have dielectric constants less than 3.9.

The drive to reduce the RC delay associated with the metal interconnect lines also has led the industry to move away from the traditional aluminum (Al) interconnect metal lines in favor of copper (Cu) based metallization. The sheet resistivity of copper-based metal lines can be half that of aluminum-based metal systems. However, copper diffuses more easily into the inter-level dielectric at normal processing temperatures, thereby degrading the dielectric and weakening the isolation between adjacent metal lines. If the copper diffuses into the underlying silicon, then the device performance also will be degraded. To prevent unwanted diffusion, most copper processes (e.g., dual damascene process) add a refractory barrier metal layer (e.g., tantalum, tantalum nitride, titanium, titanium nitride, tungsten or tungsten nitride) between the copper and the inter-level dielectric. For very narrow copper lines, applying an appropriate refractory barrier metal layer is very important. Thick barrier layers can result in higher metal line resistance than found in Al lines. Therefore, the thickness of the barrier layer must be minimized.

The drive towards increased miniaturization and the resultant increase in the RC time constant also have served as an impetus for the development of newer, low dielectric constant ("low k") materials as substitutes for conventional higher dielectric constant silicon oxide-based ILD materials. The ILD films or layers must normally be formed at relatively low temperatures in order to avoid damage to or destruction of underlying conductors. Lower processing temperatures can increase the time needed for layer formation leading to decreased manufacturing throughput. Another important consideration for RC time constant effects is that dielectric films used as ILD materials must have a low dielectric constant, as compared to the value for silicon dioxide (k=3.9), in order to reduce the RC time constant, lower the power consumption, reduce crosstalk, and reduce signal delays in closely spaced conductors.

One prior process for applying low k materials to semiconductor substrates is shown in U.S. Pat. No. 6,066,574.

First, a layer of low k material resin combined with a solvent or dispersant therefor is applied to a substrate by a spin coating process. The coated substrate is then baked at a relatively low temperature, such as 140° C. to 180° C., and for a time interval to sufficient to remove the solvent or dispersant from the coating material, such as from 30 to 90 seconds. The coated substrate is then cured at 250° C. to 350° C. for up to 90 seconds to initiate polymerization or cross-linking sufficient to convert the low k coating material to a low dielectric constant coating layer having the desired properties. The substrate with the low dielectric constant coating layer thereon is then subjected to a cool-down treatment for 30 to 90 seconds at a temperature in the range of 20° C. to 120° C. The method shown in U.S. Pat. No. 6,066,574 makes use of hot plates as the heating means. Temperature ramp up and ramp down of the coated substrate is controlled by regulating the spacing between the hot plates and the substrate, and controlling the length of time the substrate is held at a certain spacing. For baking, curing and cooling the coated substrate, three hot plates of different temperatures are used. The substrate is processed sequentially by being transferred between the hot plates. In view of this transporting, the heating of the substrate is not controlled as precisely and rapidly as is desirable for substrates that include copper interconnects.

Another known process for forming low k material layers on semiconductor substrates uses a quartz tube furnace and preheats the coated substrate for 15 to 60 minutes at temperatures from 325° C. to 350° C., then cures the coated substrate for 30 to 60 minutes at temperatures from 400° to 450° C., preferably in a nitrogen atmosphere. See EP 0 971 400 A2. Such typical furnace curing processes place severe demands on process integration. Long cure times result in decreased manufacturing throughput. However, increasing cure temperatures to reduce cure times can cause damage to, or even destroy, underlying conductors. In addition, it is difficult to suppress copper diffusion for a long duration cure, even when the cure is carried out at a lower temperature. Nevertheless, higher curing temperatures can also lead to increased copper diffusion rates. Other deficiencies of the current processes include inadequate control of the thermal budget.

U.S. Pat. No. 5,972,803 discloses a curing method for low k dielectric materials using a heating lamp with optical radiation energy in rapid thermal processing (RTP) equipment. Although the curing is described as rapid, the curing times used are up to ten minutes, which is long enough to cause undesirable diffusion of metal interconnects sought to be avoided. The processing described would be particularly undesirable for copper interconnects. See also related U.S. Pat. No. 5,705,232.

Thus, there exists a need for a method of forming a layer of low dielectric constant material on a surface of a substrate characterized by shorter curing times, higher curing temperatures, and precise control of thermal budget without the requirement of a thicker refractory barrier metal layers.

SUMMARY OF THE INVENTION

The invention provides in one embodiment a method for coating a surface of a substrate, such as a semiconductor wafer, with a layer of a low dielectric constant material, and curing the coating without substantial harm to the underlying interconnects. The method comprises the steps of (a) applying a layer of a coating material to the substrate to form a coated substrate; and (b) curing the coating by heating the coated substrate to an elevated temperature at a rapid heating rate of greater than about 20° C. per second. The coated substrate is held at the elevated temperature for a first time interval sufficient to convert the coating material to a low dielectric constant material of high thermal stability. The purpose of curing step (b) is mainly to initiate the chemical reaction(s) that produce films with high thermal stability. For most films, step (b) has very little or no effect on the dielectric constant, meaning that the k value remains nearly unaffected after the cure. Before curing, a pre-heating or baking step can be carried out to evaporate any solvents remaining in the coating material. Preferably, the baking step temperature is lower than the elevated temperature.

The first time interval of curing step (b) is generally shorter than that used in prior art methods. Depending upon the low dielectric constant material (low k material) used, the temperature-time curve with which the substrate is processed, the gas atmosphere in which the substrate is processed, and the heating method, the first time interval is preferably less than 30 seconds, more preferably less than 25 seconds, and under certain conditions even less than 20 seconds.

Preferably, the substrate is heated in a lamp-based RTP apparatus, wherein heating is by electromagnetic radiation, e.g., generated by tungsten halogen lamps, IR lamps, UV lamps, or a combination of such lamps. The electromagnetic radiation, or at least part of it, also can be generated by laser. Due to the high heating rate of the curing step, the first time interval for holding the coated substrate at an elevated temperature advantageously can be reduced. When heating is by UV radiation, the first time interval can be reduced to as short as 20 seconds.

The present invention also can be carried out using "susceptor-based RTP" systems that do not employ lamps to achieve rapid heating rates. One example of such a "susceptor-based RTP" system is described in U.S. Pat. No. 6,133,550. The wafer is rapidly inserted into a furnace cavity maintained at a substantially constant processing temperature, controllably heated by electrical heating means, preferably resistor heating means. Due to the rapid insertion, the wafer rapidly heats to the desired process temperature. Temperature ramp-up and ramp-down rates or heating/cooling rates of about 30° C. per second up to about 75° C. per second may be achieved in these types of "susceptor-based RTP" systems, sometimes also called rapid insertion rapid thermal processors ("RIRTP").

The first time interval of curing step (b) is sufficient to at least partially convert the coated material into a thermally stable low k material film. If the coated substrate is heated only once to the elevated temperature, without stepped intervals, the first time interval is selected such that within this time the material is fully converted.

The present invention alternately comprises temperature spiking processes, wherein the coated substrate is heated with a rapid heating rate, which is preferably higher than about 20° C. per second, then is cooled promptly after reaching the first temperature with a rapid cooling rate, which also is preferably higher than about 20° C. per second. In spiking processes, the first time interval may be less than one second, depending upon the heating apparatus used. In current RTP equipment, heating rates up to 500° C. per second and cooling rates up to 150° C. per second can be achieved. In spiking processes according to this invention, the first time interval of curing step (b) is determined by the change from heating to cooling, and can even be reduced to below one second, such as about 0.2 second.

The present invention also embraces temperature-time processes in which the coated substrate is heated to various elevated temperatures in a sequence of time intervals. The time intervals can comprise intervals in which the substrate is cooled down to lower temperatures. Multiple spike processing, in which one spike is followed by at least one other spike, may be used. The time interval between two spike processes, meaning the time interval between subsequent rapid cooling and rapid heating, is preferably less than about 30 seconds, and can be as short as about 0.2 seconds, the minimum time for changeover from cooling to heating. In multiple spike processes, it can be sufficient for the coating material to be only partially converted into low k material within one spike process or within one time interval in which the substrate is heated to an elevated temperature because the coated material will be fully converted in a following time interval or spike process in the sequence.

An elevated temperature is selected within a temperature range embracing the lowest temperature at which curing of the coating material starts at the chosen process parameters and the highest temperature at which the coating material starts to decompose. Process parameters that may impact the chosen elevated temperature range include atmosphere content and pressure, coating material composition, heating rate, and spectrum of electromagnetic radiation selected for heating. Ideally, the highest temperature in the temperature range is lower than the decomposition temperature of the coating material to account for the possibility that the heating will not be uniform across the substrate. This will ensure that the low k material does not decompose even if the temperature distribution across the substrate is not uniform. However, in spike processes, the elevated temperature may exceed the decomposition temperature for a short time, preferably less than one second, if the temperature ramp up and ramp down rates are higher than 50° C. per second.

In the preferred embodiment, the heating rate is up to 50° C. per second, and the elevated curing temperature is within the range of 450° C. to 475° C. Preferably, the curing time interval is 60 seconds or less, most preferably about 30 seconds.

Preferably, the gas atmosphere in which the coated substrate is processed is dominated by an inert gas. Depending upon the temperature, molecular nitrogen can be used as the inert gas. Below 1100° C., nitrogen will not react with silicon or with most low k materials. However, noble gases (argon and helium) or noble gases mixed with nitrogen can be used. As one possibility, with the beginning of the temperature ramp down, the composition of the atmosphere can be changed by adding helium to the nitrogen gas. The thermal conductivity can be increased by adding helium, which helps to speed the cooling rate. Only about ten percent (10%) helium by volume in the atmosphere is sufficient to nearly double the thermal conductivity of the atmosphere. If the coating or low k material does not react with molecular hydrogen gas, such gas also can be introduced to manipulate the thermal conductivity of the process atmosphere. In addition, added hydrogen gas or ammonia can prevent oxidation of the coating material or of other layers or structures on the substrate.

Due to the precise control of the process gas in an RTP apparatus, the present invention also offers the possibility of carrying out selective reactions while curing the coating material. Exemplary selective reactions include oxidation or reduction processes occurring at certain layers or films, or parts thereof, on the substrate. When selective reactions are carried out, the process atmosphere can include an oxygen containing component and a hydrogen containing component (e.g., $H_2O$, $NO$, $N_2O$, $O_2$, $O_3$, $H_2$, $NH_3$) in appropriate concentrations. The flow conditions of the coating material and/or the low k material can be influenced by the process gas, such as by adding $H_2O$ (in the form of steam) together with hydrogen to prevent oxidation reactions. The coated substrate may also be processed in a vacuum. The coated substrate also may be processed in a vacuum. In the preferred embodiment, the curing step is performed in an environment composed substantially of nitrogen. Most preferably, the oxygen concentration in the curing environment is maintained below about 10 ppm.

The inventive method may further comprise the step of (c) cooling the substrate coated with a low dielectric constant material to a temperature lower than the elevated temperature at a rapid cooling rate greater than about 20° C. per second. In addition, the method may also include the step of preheating or baking the coated substrate to a first temperature prior to curing so as to liberate substantially all of any added solvent or dispersant from the coating material.

By curing the low k dielectric materials using very short, relatively high temperature cycles instead of the conventionally used (lower temperature/longer time) thermal cycles of the prior art, the inventive method obtains advantages not found in the prior art. First, the inventive method obtains equivalent curing in a shorter time. Shorter curing times result in higher throughput. Second, by heating rapidly, the inventive method reduces copper diffusion through the underlying refractory barrier metal layer. This allows for a thinner refractory barrier metal layer thickness to prevent copper diffusion. In addition to cost savings, a thinner refractory barrier metal layer translates to lower interconnect resistance because the contribution of the refractory barrier metal layer to the overall resistance is minimized. Overall, the throughput is increased and the costs are decreased because thinner barrier layers can be used.

DESCRIPTION OF THE PREFERRED EMBODIMENTS

Figure 1:
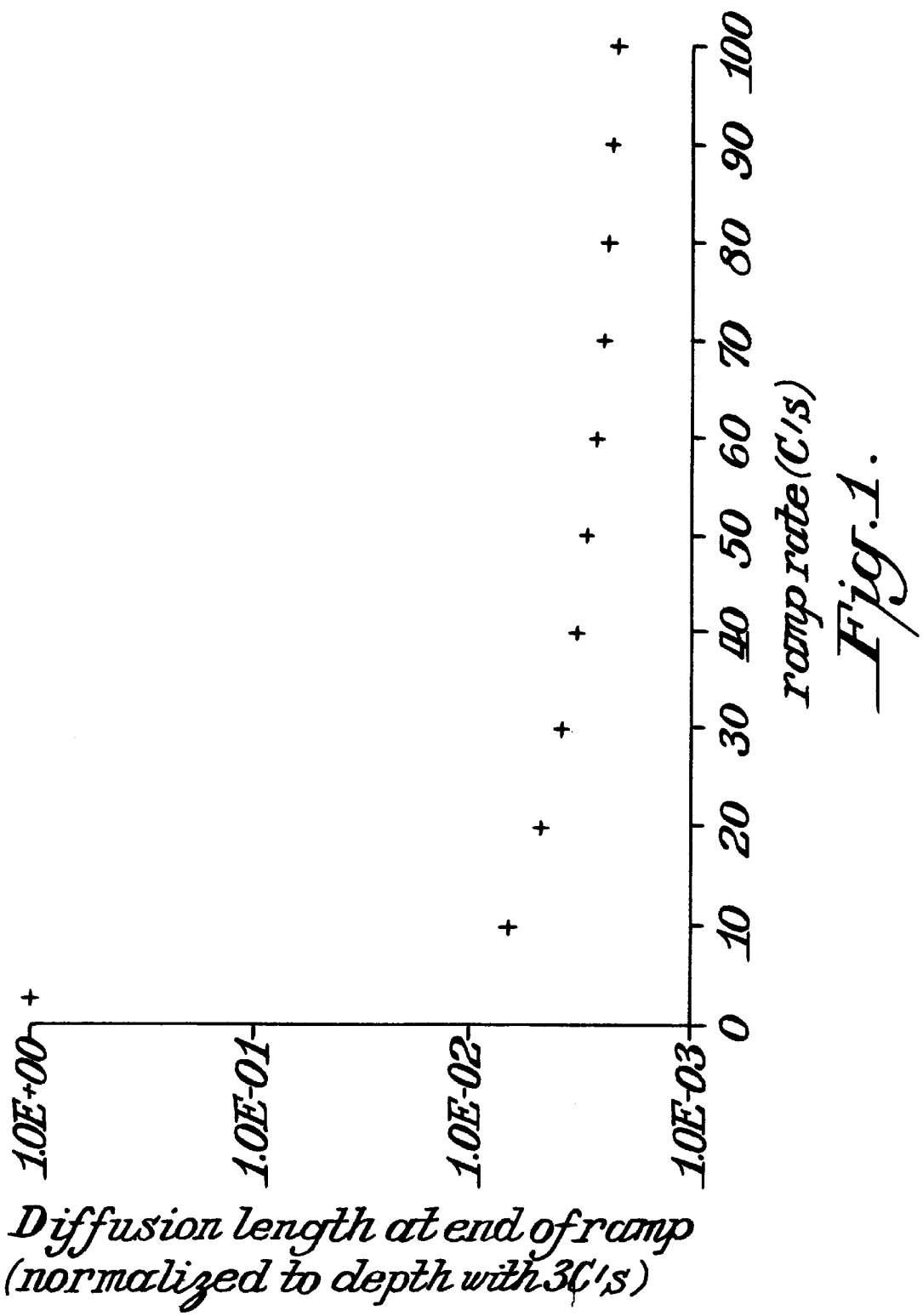
FIG. 1 is a graph showing the effect of linear heating ramp rate on the diffusion of copper on $TaN_{0.62}$ at a 475° C. curing temperature, and an Ea=0.5 eV.
Figure 2A:
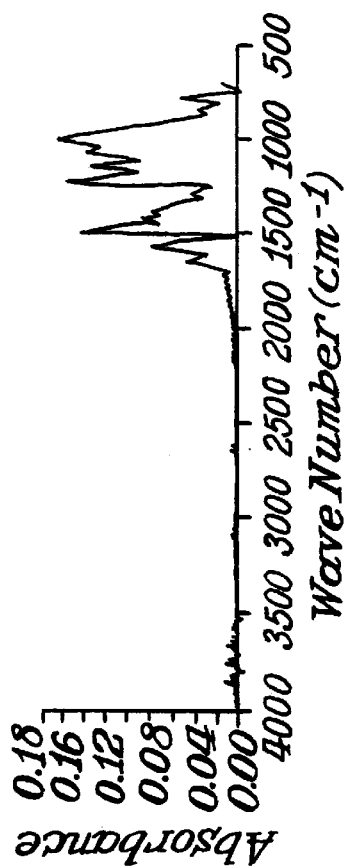
FIGS. 2A–2F shows Fourier Transform Infrared spectroscopy (FTIR) spectra of FLARE films with cure conditions indicated.
Figure 2B:
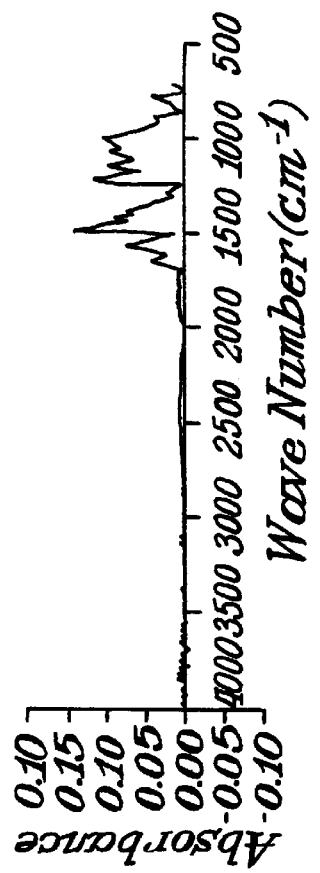
Figure 2C:
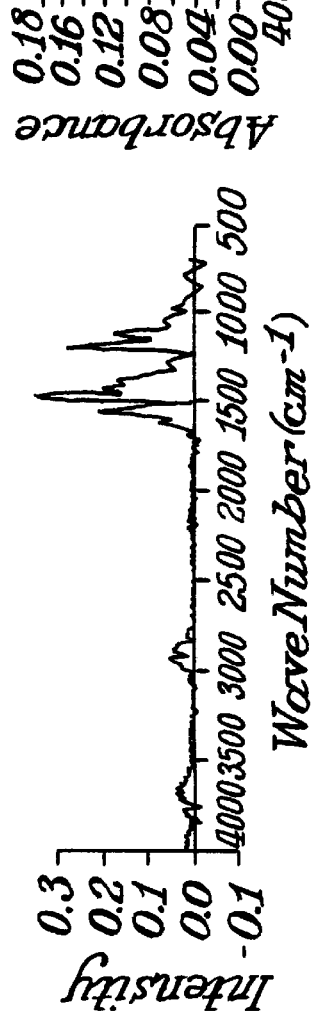
Figure 2D:
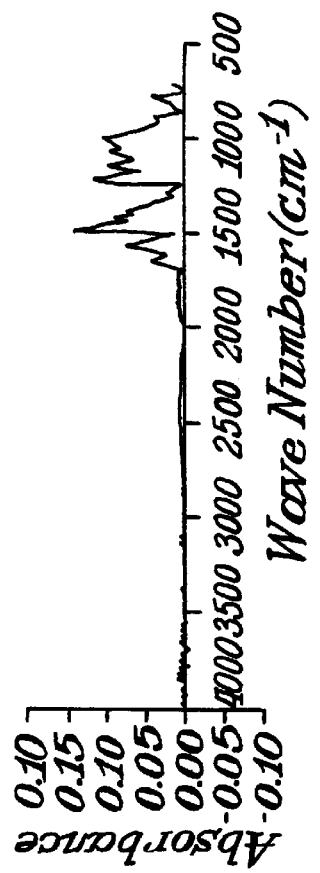
Figure 2E:
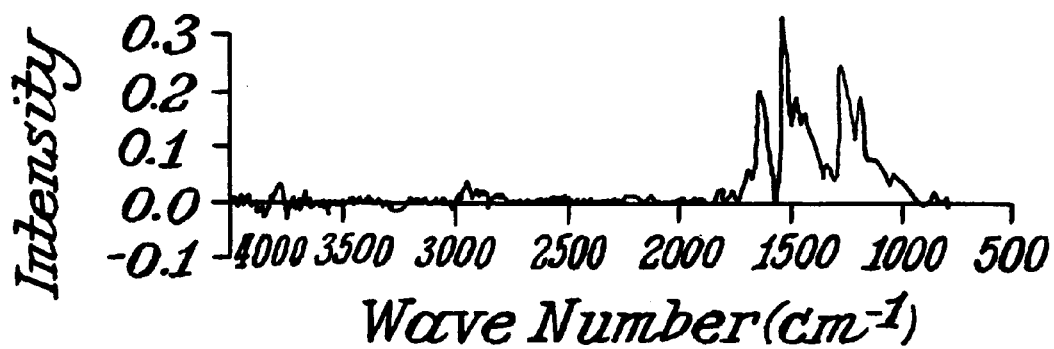
Figure 2F:
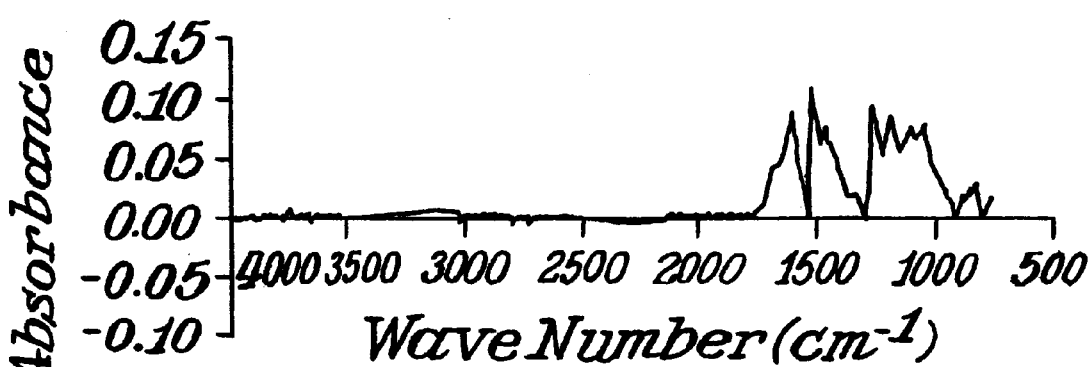

The coating material is a low dielectric constant material (low k material) or resin, such as poly(arylene ethers) (e.g., FLARE sold by Honeywell Electronic Materials), polyimide-SSQ hybrids, hydrogen silsesquioxane (e.g., FOX and XLK from Dow Corning), methyl silsesquioxane (e.g., SSQ from Dow Corning), polyimides, fluorinated polyimides, poly(arylenes), cyclotenes, siloxanes, poly (norbonenes), Teflon FEP, Teflon-AF, Teflon (from E. I DuPont de Nemours & Co.), SPEEDFILM (a Teflon-based product from W. L. Gore & Associates), polyimide nanofoams, silica aerogels, silica xerogels, mesoporous silica, octadecyl-acrylate, benzocyclobutene (e.g., from Dow Chemical), perfluorocyclobutane, fluorinated and organically doped $SiO_2$, paraxylenes (e.g., tetrafluoroparaxylenes), nanoglasses, porous organosilicates (e.g., from Dow Chemical and IBM), organic nanofoams, and SILK (a fluoride free aromatic hydrocarbon from Dow Chemical Co.), among others. Any material that forms a film that can be spin coated to a substrate and which upon being cured, is converted to a low dielectric constant coating layer having the desired properties, may be suitable as the low k material. It is preferred that upon curing, the coating material would have a dielectric constant of below about 3.9, more preferably below about 3.0.

Typically, the coating material is combined with a suitable solvent or dispersant to facilitate processing. The solvent and/or dispersant is compatible with the coating material, and should not change the chemical structure of the coating material. In addition, the solvent should be sufficiently volatile and have a low boiling point. For example, FLARE is sold in the form of a solution of poly(arylene ether) in a cyclohexanone solvent. Representative solvents that have been used with the coating materials are cyclohexanone, cyclopentanone, n-methyl pyrollidone, isobutyl ketone, methyl siloxane, and fluorocarbon solvents.

The low k coating material may be applied to one or more surfaces of a substrate. In the preferred embodiment, the substrate is a single crystal silicon semiconductor wafer. The semiconductor wafer may have at least one active device region formed therein or thereon. Alternatively, the substrate to be coated may comprise the patterned metal layers of a multilevel integrated semiconductor device. The semiconductor wafer may further comprise a plurality of copper interconnect lines separated from the interlayer dielectric by a refractory barrier layer formed from a material selected from the group consisting of, but not limited to, tantalum (Ta), tantalum nitride ($TaN_x$), titanium (Ti), titanium nitride ($TiN_x$), tungsten (W), and tungsten nitride (WN).

The low k coating material may be applied to the substrate using a spin coating process. With spin coating, the substrate to be coated is mounted to a spinning plate. The coating material is deposited through a nozzle directed at the center of the rapidly spinning substrate. Centrifugal force distributes the coating material over the substrate surface. Excess coating material is flung from the edge of the substrate. The spin coating apparatus often is of the same type that is conventionally used to deposit photoresist. Spin coating methods are described, for example, in prior U.S. Pat. Nos. 5,238,878, 5,358,740, and 6,033,728.

After the coating material has been applied to the substrate, the substrate is heated to a first temperature in the range from 150° C. to 250° C. for a time interval sufficient to liberate substantially all of any solvent or dispersant, if present, from the coating material. Typical time intervals for such a pre-heating step are from sixty seconds to three minutes. This pre-cure heating step may also involve a heating cycle, such as wherein the coated substrate is heated first to 150° C. and held for a short time (e.g., in the range of from 10 to 90 seconds), then to 200° C. and held for a short time as mentioned before, and finally to 250° C. and held for a short time as mentioned before.

Once the solvent and/or dispersant have been liberated, the coated substrate is then heated for curing. The cure temperature, or elevated temperature, should be sufficient to convert the coating material to a low dielectric constant coating layer during the selected curing time, or within the cycle of multi-spike processing.

Preferably, the cure temperature used approaches the decomposition temperature of the selected low k material in the coating. For example, for a coating material comprising poly (arylene ether), the preferred elevated temperature, or cure temperature, is about 475° C. A cure temperature, or elevated temperature, above 475° C. could be used for low k materials that have better thermal stability than poly (arylene ether). In addition, the heating temperature for curing may exceed the decomposition temperature for a very short interval during spike processing.

Heating rates greater than about 20° C. per second should be used when heating the coated substrate to the elevated curing temperature. Most preferably, the heating rate should be greater than about 50° C. per second. Rapid heating for curing is an important aspect of the invention. Thermal curing cycles are preferably 60 seconds or shorter, more preferably about 30 seconds. However, exact curing time is a function of the selected coating material, cure temperature, process gas ambient atmosphere, time-temperature process conditions and heating conditions, such as with or without extra UV radiation.

During the curing step, it is preferable to maintain the substrate in an environment in which the oxygen level is below about 10 ppm to avoid undesired oxidation. An inert gas environment, particularly an atmosphere composed substantially of nitrogen, is most preferred.

Following the curing step, the substrate now coated with a low dielectric constant coating layer may then be controllably cooled to a temperature cool enough to permit the coated substrate to be removed safely from the apparatus without damage to the substrate or the coating. Controlled cooling preferably is conducted rapidly, with cooling rates greater than about 20° C. per second. Most preferably, the cooling rate exceeds about 50° C. per second. The cooled temperature at which the coated substrate is removed from the heating apparatus preferably is less than 300° C. If removed while still at a higher temperature, the cured film may oxidize when exposed to atmospheric oxygen.

Although not wishing to be bound by any one theory, the inventors have observed that typical curing reactions for low k films are extremely temperature sensitive, so the curing time may be drastically reduced by raising the curing temperature by just 25° C. to 50° C. Diffusion of copper through typical refractory barrier metal layers is also thermally initiated, however this phenomena is not as temperature sensitive as low k curing reactions. In other words, the activation energy for the chemical reaction involved in low k curing is much higher than that of the diffusion of copper. A high temperature cure therefore enhances throughput by speeding the curing process, but suppresses some copper diffusion for the same level of cure. This allows for a thinner barrier layer to be used in order to inhibit copper diffusion and reduces the contribution of the barrier layer to the overall line resistance.

In general, the chamber atmosphere may be maintained at atmospheric pressure or elevated pressure. The composition of the atmosphere may be varied during the different processing steps. For example, if the coated substrate is heated in a nitrogen gas atmosphere, other gases, such as helium, may be introduced to the atmosphere during the cooling step. Faster cooling is achieved by increasing thermal conductivity when helium is introduced. Only about 10% helium in the atmosphere is sufficient to nearly double the thermal conductivity of the atmosphere. Alternatively, if the coating or low k dielectric material does not react with molecular hydrogen gas, such gas could be introduced to vary the thermal conductivity of the processing atmosphere. Hydrogen gas and ammonia advantageously prevent oxidation of most coating materials and most layers on semiconductor substrates.

An example, which is provided for purposes of illustration, and which is not limiting on the scope of the invention, illustrates one advantage of the method of the present invention. Based on the International Technology Roadmap for Semiconductors (1999 edition), the barrier layer thickness for the 130 nm generation (year 2002) should be about 13 nm. The method of the present invention reduces the diffusion of copper by about 50%, so that now a barrier layer of 6.5 nm will be adequate to prevent copper diffusion. If the structure consists of a 0.35 μm copper line deposited on a 6.5 nm thick tantalum (Ta) barrier layer, the reduction of potential copper diffusion translates to approximately a 11% decrease in line resistance (for the same overall dimensions of the metal+barrier layer). The effect of this on interconnect delay is the same as replacing $SiO_2$ by low k materials, such as fluorinated glass, as the inter-level dielectric.

The maximum benefits of the curing method of the present invention are realized when high heating and cooling rates are used. Preferably, the heating and cooling rates are greater than about 20° C. per second, more preferably, greater than about 50° C. per second. If the substrate takes a long time to reach the desired curing temperature, then the amount of parasitic diffusion taking place at the lower temperature during heating and cooling may be significant and could add to the diffusion taking place at the desired cure temperature, or elevated temperature.

In a particularly preferred embodiment of the method, it is contemplated that the coating may be applied, and the coated substrate may be heated and cooled in a single apparatus. Most preferably, the substrate may remain in a single chamber within the single apparatus during the coating, heating and cooling steps. In addition, the substrate may remain on a single holder during one or more of the various coating and curing processing steps.

When a spike process is used, the coated substrate is heated rapidly to a first temperature, then immediately cooled. There is no intended dwell time at the elevated first temperature. The rapid heating and cooling are repeated in a multi-spike process. The spike temperatures for the different heating spikes may be the same or may vary. For example, a first spike could be used to liberate the solvent from the coating. A second spike could be used to enhance the adhesion of the coating. A third spike could then be used to cure the coating film. In general, a high temperature multi-spike process is useful if the activation energy for the processing step (such as solvent evaporation or film curing) is higher than that for the undesired side effect (such as copper diffusion or thermal degradation of the film). The maximum spike temperature is limited by the temperature at which thermal degradation of the coating film starts to occur.

The high temperatures, rapid heating rates and short time intervals of the inventive method are best carried out in a rapid thermal processing (RTP) apparatus. In an RTP apparatus, heat lamps are provided in an array around a quartz chamber. The heat lamps are generally tungsten-halogen lamps, but arc lamps, IR lamps, flash lamps, arc lamps, or any other source of visible and/or near infrared radiation or UV radiation may be used. Lasers may also be used in some applications. The radiation from the lamps is directed through the transparent portions of the quartz walls onto the flat surface(s) of the substrate held within the chamber. Alternatively, susceptor-based RTP systems that do not employ lamps to perform fast heating, or also a combination of heat lamps with susceptor-based RTP or RIRTP systems can be used.

Applying UV radiation in the wavelength range of between 180 nm and 400 nm supports the curing of coating materials that are transformed to low k materials by improving the cross-linking. To gain these advantages, the RTP apparatus, whether lamp-based or susceptor-based, may comprise UV radiation means, like flash lamps or arc lamps. If the coated substrate is illuminated and thus heated with UV radiation during the temperature ramp up, the process time necessary for curing the coated material can be reduced. The time reduction depends upon the intensity of the UV radiation, which is controllable as a function of time. If the substrate is a silicon wafer, preferably radiation in the visible and IR range, e.g., produced by tungsten halogen lamps, is used to heat the coated substrate and coating material. UV radiation mainly has advantage when used for supporting cross-linking processes. UV illumination at predetermined temperatures of the coated substrate are applicable to the invention. As an example, if a coated substrate is cured by a spike or multi-spike process, one of several UV flashes can be applied when the substrate reaches its peak temperature(s). The substrate peak temperature can be lowered, but the same curing efficiency can be achieved, if UV flashes are used.

RTP has been used mainly for front end semiconductor fabricating processes, such as rapid thermal annealing (RTA) and rapid thermal oxidation (RTO), since these benefit from one or more of the principal attributes, namely high temperature, short time processing in a highly controlled mini-environment with very high heating and cooling rates. Typical RTP treatments, such as, for example, described in prior U.S. Pat. Nos. 4,331,485, 4,356,384 and 4,680,451, involve heating the semiconductor substrate from room temperature to a prescribed elevated process temperature, such as from 200° C. to 1700° C. (for silicon up to 1250° C. only) in a matter of 1 to 300 seconds. In the present invention, RTP methods may be used to cure low-K coatings on a semiconductor substrate.

U.S. Pat. Nos. 5,965,047 and 6,051,512 describe RTP systems that may be adapted for use with the method of the invention. Commercially available RTP systems include various models from Mattson Technology, Inc.

EXAMPLES

The invention uses high temperature curing cycles with rapid heating/cooling rates to obtain equivalent cure of low dielectric constant materials in reduced processing times. Diffusion of copper is minimized because it is not as temperature sensitive as low k curing reactions. In other words, the activation energy for the chemical reaction involved in low k curing is much higher than that of the diffusion of copper. A high temperature cure therefore enhances throughput by speeding the curing process, but suppresses some copper diffusion for the same level of cure. The following examples are provided for illustration only, and should not be considered as limiting the scope of the invention.

The coating material selected for the examples was a solution of poly(arylene ether) polymer in cyclohexanone solvent. This solution is sold by Honeywell Electronic Materials/Allied Signal under the tradename FLARE. When cured, the FLARE material has a known dielectric constant of 2.85.

A 0.38 μm film was spin coated onto an 8" silicon semiconductor wafer substrate using highly controlled, state of the art deposition conditions such as shown in Table 1 to form a coated substrate.

TABLE 1

Spin-coating Sequence

| Step | Action | Time (sec.) | Speed (rpm) |
|---|---|---|---|
| 1 | Pre-dispense | 0.2 | 0 |
| 2 | Dispense | 3.0 | 3000 |
| 3 | Spread | 0.1 | 3000 |
| 4 | Thickness spin | 40.0 | 3000 |
| 5 | Backside rinse | 6.0 | 1500 |
| 6 | Edge-bead rinse | 4.0 | 1500 |
| 7 | Spin dry | 4.0 | 3000 |
| 8 | Spin dry/nozzle rinse | 1 | 3000 |

The coated substrate was then subjected to a multi-stage heating cycle in order to remove the cyclohexanone solvent. The coated substrate was first heated to 150° C. and held at that temperture in a nitrogen gas atmosphere for 60 seconds. Then, the coated substrate was heated to 200° C. and held for another for 60 seconds. Finally, the substrate was heated to 250° C. and held for 60 seconds. This solvent in FLARE coating is known to have a boiling point of 155 ° C.

The coated substrate was cleaved into smaller samples using a diamond scribe. These individual samples were cured under different conditions after placing them at the center of an 8" K-type thermocouple (T/c) wafer. T/c control was used for all experiments.

Each of the small coated substrate samples was placed into a Mattson Technology HEATPULSE RTP chamber for curing. Previously, the chamber was confirmed to be leak tight by running a titanium coated wafer at 675° C. for 20 seconds and noting that there was no discoloration. The chamber interior held an environment composed substantially of nitrogen.

Some of the samples were cured at an elevated temperature of 450° C., for a first time interval of 30 seconds. Other samples were cured at an elevated temperature of 450° C., for a first time interval of 60 seconds. The curing for still other samples was carried out at an elevated temperature of 475° C. for a first time interval of 15 seconds. Yet other samples were cured at an elevated temperature of 475° C. for a first time interval of 30 seconds.Yet other samples were cured at an elevated temperature of 450° C. for a first time interval of 30 seconds. Yet other samples were cured at an elevated temperature of 450° C. for a first time interval of 60 seconds. In all cases, the heating rate was greater than about 50° C. per second. Finally, some of the samples (comparison) were cured at an elevated temperature of 425° C. for a first time interval 180 seconds as comparable to prior art conditions.

Fourier Transform Infrared spectroscopy (FTIR) analysis of all post-cure coating materials was carried out in the 750 to 4000 cm$^{-1}$ wavenumber range. A coating material that has not been fully cured shows an absorbance peak at the 2200 cm$^{-1}$ wavenumber. This peak is absent for a fully cured coating material. FIG. 2 shows FTIR plots for examples A through F as summarized below in Table 1. The cure conditions are indicated on the FTIR plots and in Table 2. The absorbance peak at 2200 cm$^{-1}$ is normalized to the maximum absorbance peak in the range.

TABLE 2

Summary of FTIR Data

| Example | Cure Temperature (Elevated Temperature) | Time (First Time Interval) | Absorbance peak at 2200 cm$^{-1}$ | Fully Cured |
|---|---|---|---|---|
| A | No cure | Bake only | 0.02 | No |
| B | 425° C. | 180 s | ~0 | Yes |
| C | 450° C. | 30 s | 0.0077 | No |
| D | 450° C. | 60 s | ~0 | Yes |
| E | 475° C. | 15 s | 0.0087 | No |
| F | 475° C. | 30 s | ~0 | Yes |

Table 2 shows that 450° C./30 sec. and 475° C./15 sec. cure cycles achieve only a partial cure as evidenced by the existence of a small peak at the 2200 cm$^{-1}$ wavenumber. The 470° C./30 sec. and 450° C./60 sec. cure cycles achieve the same level of curing as the sample simulating the prior art (425° C./80 sec.). These higher temperature cures have the advantage of faster cure times, and therefore increased manufacturing throughput.

Another advantage is lower copper diffusion. This is illustrated in Table 3 below, which shows the diffusion lengths for the diffusion of copper through tantalum and various tantalum nitride, TaN$_x$, refractory barrier metal layers for low k cure cycles that lead to complete coating material cure. The diffusion lengths, $(D*t)^{0.5}$, are shown for the conditions that lead to a complete cure. All values are normalized to the diffusion length for a 400° C. cure temperature and a one hour cure time, which is the standard cure step. The diffusion coefficient, pre-exponential factors, and activation energy for the diffusion of copper through TaN$_x$ refractory barrier metal layers was obtained from published literature. J-C. Lin and C. Lee, *Electrochem. Soc.*, 146(9), p. 3466 (1999). For copper diffusion through tantalum, the activation energy of 0.038 eV was used as determined through in-house experiments.

TABLE 3

Diffusion Lengths for Diffusion of Copper Through Ta and TaN$_x$

| Diffusion Barrier | Example | Cure Temp | Cure Time (sec.) | Diffusion Length |
|---|---|---|---|---|
| Ta | G | 425° C. | 180 | 0.226381 |
|  | H | 450° C. | 60 | 0.13221 |
|  | I | 475° C. | 30 | 0.094493 |
| TaN$_{0.62}$ | J | 425° C. | 180 | 0.260864 |
|  | K | 450° C. | 60 | 0.173842 |
|  | L | 475° C. | 30 | 0.140532 |
| TaN$_{0.69}$ | M | 425° C. | 180 | 0.268202 |
|  | N | 450° C. | 60 | 0.183407 |
|  | O | 475° C. | 30 | 0.15188 |
| TaN$_{0.85}$ | P | 425° C. | 180 | 0.279166 |
|  | Q | 450° C. | 60 | 0.19816 |
|  | R | 475° C. | 30 | 0.169909 |
| TaN$_{0.99}$ | S | 425° C. | 180 | 0.286135 |
|  | T | 450° C. | 60 | 0.207822 |
|  | U | 475° C. | 30 | 0.182052 |
| TaN$_{1.23}$ | V | 425° C. | 180 | 0.291476 |
|  | W | 450° C. | 60 | 0.215377 |
|  | X | 475° C. | 30 | 0.191725 |

Table 3 shows that using higher cure temperatures (elevated temperatures) helps to reduce diffusion of copper. With this result, thinner refractory barrier metal layers are sufficient to prevent undesired copper diffusion. For example, the required thickness of a TaN$_{0.62}$ barrier layer for a cure temperature of 475° C. for a first time interval of 30 seconds, Example L, would only be 14% of the thickness needed for a cure temperature of 400° C. for one hour. A thinner refractory barrier metal layer results in significant improvement in line resistance and also allows for improvements in manufacturing throughput.

Theoretically, even higher temperatures should yield even greater benefits in terms of reduced cycle times and thinner refractory barrier metal layer requirements. However, maximum cure temperature is dictated by the decomposition temperature of the selected low k material. For the poly (arylene ether) material tested, the decomposition temperature is around 475° C. A cure temperature, or elevated temperature, above 475° C. could be used for other low k materials with better thermal stability than the FLARE material.

The full benefits of the method of the present invention are not realized unless high heating rates are used. Preferably, both the heating and cooling rates are greater than 20° C. per second, and more preferably, greater than 50° C. per second. If the substrate takes too long to reach the desired curing temperature, the amount of parasitic diffusion taking place at the lower temperature during heating and cooling will be significant, and could add to the diffusion taking place at the desired set point or cure temperature.

A simple model using simplified diffusion equations was used to predict the diffusion length at the end of the curing step as a function of heating rate, or ramp rate, for copper diffusion through a $TaN_{0.62}$ barrier. The diffusion length was normalized to the diffusion length at a heating rate of 3° C. per second, which is the typical rate for a state of the art fast ramp furnace. FIG. 1 is a graph showing the effect of ramp rate on the diffusion length at the end of the ramp for copper on $TaN_{0.62}$. The graph assumes a linear ramp, a 475° C. curing temperature, and an Ea=0.5 eV. The graph shows that diffusion length is minimized at higher ramp rates. Further, it is shown that diffusion length is reduced by a factor of about 2 at the end of the temperature ramp up if the ramp is increased from about 20° C. per second to about 80° C. per second.

Figure 3:
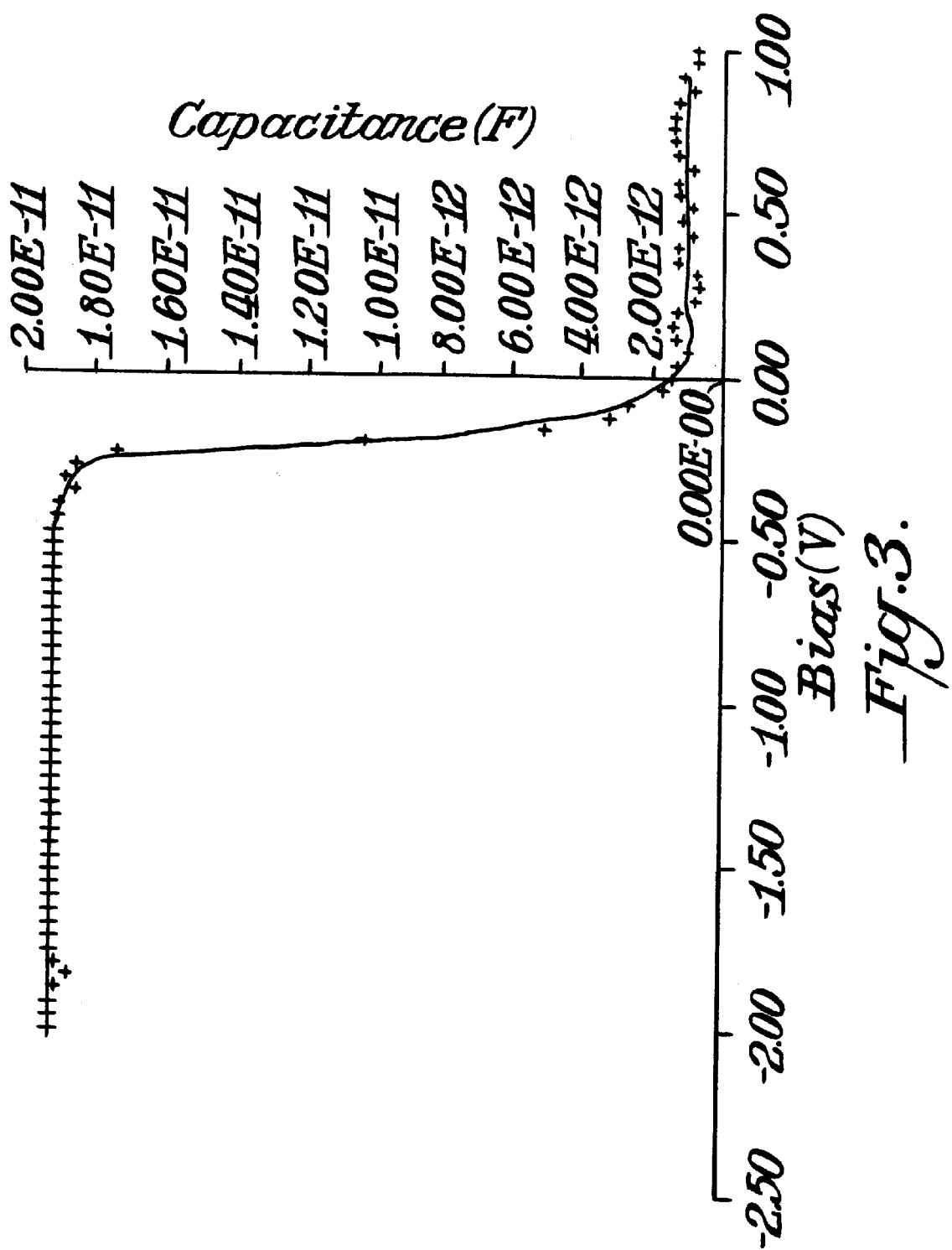
FIG. 3 is a graph of Capacitance versus Bias (C-V) for a substrate coated with FLARE film and cured at 250° C. for 180 seconds.

Capacitance-Bias (C-V) curves of all post-cure coating materials were determined using a mercury probe. The coating thickness was determined using the accumulation capacitance values and assuming a dielectric constant (k) of 2.85. FIG. 3 is a Capacitance-Bias (C-V) curve of FLARE film at 250° C. for 180 seconds. The thickness of each sample was calculated to be 0.38 μm, which was in agreement with post-heating thickness calculated by the coating vendor. Therefore, none of the coating materials suffered a thickness loss after curing, which indicates that thermal decomposition, if any, was negligible for the cure cycles investigated.

While the invention has been described by way of examples and in terms of several preferred embodiments, the invention should not be limited to the disclosed embodiments. On the contrary, applicants intend to cover various modifications and similar arrangements, including modifications resulting from combinations of the features described above, all within the spirit and scope of their invention as claimed in the following claims.

We claim:

1. A method for coating a surface of a substrate with a layer of a low dielectric constant material, comprising the steps of:
   (a) applying a layer of a coating material to a substrate to form a coated substrate;
   (b) curing the coating by heating the coated substrate to an elevated temperature at a heating rate of greater than about 20° C. per second; and
   (c) cooling the substrate coated with a low dielectric constant material to a temperature lower than said elevated temperature at a cooling rate greater than about 20° C. per second.

2. The method of claim 1, wherein the coating material contains a solvent or a dispersant.

3. The method of claim 2, further comprising the step of:
   (a2) heating the coated substrate to a first temperature and for a time interval sufficient to liberate substantially all of the solvent and all of the dispersant from the coating material.

4. The method of claim 1, wherein the curing step (b) is performed in an inert gas environment.

5. The method of claim 4, wherein the curing step (b) is performed in an environment composed substantially of nitrogen.

6. The method of claim 1, wherein the curing step (b) is performed in an environment in which the oxygen concentration is kept below about 10 ppm.

7. The method of claim 1, wherein all steps are performed in an environment in which the oxygen concentration is kept below about 10 ppm.

8. The method of claim 7, wherein all steps are performed in an environment composed substantially of nitrogen.

9. The method of claim 1, wherein the heating rate for the curing step (b) is greater than about 50° C. per second.

10. The method of claim 1, wherein the cooling rate for cooling step (c) is greater than about 50° C. per second.

11. The method of claim 1, wherein the elevated temperature is in the range of from 0° C. to 30° C. below the decomposition temperature of the coating material.

12. The method of claim 1, wherein the coated substrate is held at the elevated temperature for a first time interval sufficient to at least partly convert the coating material to a low dielectric constant material.

13. The method of claim 12, wherein the first time interval is 60 seconds or less.

14. The method of claim 12, wherein the first time interval is 30 seconds or less.

15. The method of claim 12, wherein the first time interval is 1 second or less.

16. The method of claim 1, wherein the substrate is held within a single apparatus during the applying step (a), the curing step (b), and the cooling step (c).

17. The method of claim 1, wherein the substrate is held within a single apparatus during the curing step (b) and the cooling step (c).

18. The method of claim 16, wherein the substrate remains on a single holder.

19. The method of claim 17, wherein the substrate remains on a single holder.

20. The method of claim 1, wherein heating is by electromagnetic radiation generated by tungsten-halogen lamps, IR lamps, UV lamps, flash lamps or arc lamps or a combination of such lamps, by laser or by electrical heating means of an RIRTP system.

21. The method of claim 1, wherein the layer of coating material is applied to the substrate by spin coating, spray coating, PVD or CVD.

22. The method of claim 1, wherein the substrate is a semiconductor wafer.

23. The method of claim 22, wherein the semiconductor wafer is formed from a single crystal silicon or polycrystalline silicon.

24. The method of claim 22, wherein the semiconductor wafer has at least one active device region formed therein or thereon.

25. The method of claim 24, wherein the semiconductor wafer further comprises a plurality of copper interconnect lines separated from an interlayer dielectric layer by a refractory barrier layer formed from a material selected from the group consisting of tantalum, tantalum nitride, titanium, titanium nitride, tungsten and tungsten nitride.

26. The method of claim 12, wherein the coating material is cured for a first time interval sufficient to convert the coating material to a material with a low dielectric constant of below about 3.9.

27. The method of claim 12, wherein the coating material is cured for a first time interval sufficient to convert the coating material to a material with a low dielectric constant of below about 3.0.

28. A method for curing a coating of a low dielectric constant material that has been applied to the surface of a substrate, comprising the steps of:
  (a) spike heating the coated substrate to a first elevated temperature at a heating rate of greater than about 50° C. per second;
  (b) holding the coated substrate at the first elevated temperature for a first time interval not exceeding one second; and
  (c) cooling the substrate coated with a coating material to a temperature lower than said elevated temperature at a cooling rate greater than about 50° C. per second.

29. The method of claim 28, further comprising:
  (d) spike heating the coated substrate to a second elevated temperature, which may be the same as or different from the first elevated temperature, at a heating rate of greater than about 50° C. per second;
  (e) holding the coated substrate at the second elevated temperature for a second time interval not exceeding one second; and
  (f) cooling the substrate coated with a coating material to a temperature lower than said elevated temperature at a cooling rate greater than about 50° C. per second.

30. The method of claim 28, wherein the substrate is a semiconductor wafer.

31. The method of claim 28, wherein the coating material is fully cured prior to the cooling step (c).

32. The method of claim 29, wherein the coating material is only partly cured prior to the spike heating step (d).

33. A semiconductor wafer coated with a low dielectric constant material that has been cured according to the method of claim 22.

34. A semiconductor wafer coated with a low dielectric constant material that has been cured according to the method of claim 30.

* * * * *